(12) United States Patent
Huang

(10) Patent No.: US 6,777,815 B2
(45) Date of Patent: Aug. 17, 2004

(54) CONFIGURATION OF CONDUCTIVE BUMPS AND REDISTRIBUTION LAYER ON A FLIP CHIP

(75) Inventor: Jimmy Huang, Taipei (TW)

(73) Assignee: Via Technologies, Inc., Taipei (TW)

(*) Notice: Subject to any disclaimer, the term of this patent is extended or adjusted under 35 U.S.C. 154(b) by 0 days.

(21) Appl. No.: 10/212,804

(22) Filed: Aug. 7, 2002

(65) Prior Publication Data

US 2003/0042619 A1 Mar. 6, 2003

(30) Foreign Application Priority Data

Aug. 29, 2001 (TW) .......................... 90121365 A

(51) Int. Cl.[7] .................. H01L 23/48; H01L 23/52; H01L 29/40
(52) U.S. Cl. .................. 257/778; 257/786; 257/784; 257/737; 257/776
(58) Field of Search ................. 257/778, 786, 257/784, 737, 776

(56) References Cited

U.S. PATENT DOCUMENTS

| | | | |
|---|---|---|---|
| 5,739,587 A | * | 4/1998 | Sato .......................... 257/758 |
| 5,952,726 A | * | 9/1999 | Liang ........................ 257/778 |
| 6,057,596 A | * | 5/2000 | Lin et al. ................... 257/697 |
| 6,191,479 B1 | * | 2/2001 | Herrell et al. .............. 257/724 |

* cited by examiner

Primary Examiner—Nathan J. Flynn
Assistant Examiner—Victor A. Mandala, Jr.
(74) Attorney, Agent, or Firm—Troxell Law Office PLLC

(57) ABSTRACT

A configuration of conductive bumps on a flip chip and a redistribution layer is disclosed. The configuration comprise: a plurality of power bumps and ground bumps disposed in hive-shaped arrangement on the core of a flip chip; a plurality of power lines slanted by 60-degree angle, relative to a horizontal line, for connecting power bumps; and a plurality of ground lines slanted by 60-degree angle, relative to a horizontal line, for connecting ground bumps. The conductive bumps of the second embodiment are disposed in a checkerboard arrangement. The conductive bumps of the third embodiment are disposed in a staggered arrangement, and the power bumps and the ground bumps are respectively connected by power lines and ground lines, which are slanted in 45-degree angle, relative to a horizontal line. The power lines and the ground lines are in the redistribution layer.

7 Claims, 3 Drawing Sheets

CONFIGURATION OF CONDUCTIVE BUMPS AND REDISTRIBUTION LAYER ON A FLIP CHIP

This application incorporates by reference Taiwanese application Serial. No. 90121365, filed on Aug. 29, 2001

BACKGROUND OF THE INVENTION

1. Field of the Invention

This invention relates to a method of packaging integrated circuits, particularly to a configuration of a redistribution layer applied in the core of a flip-chip with power bumps and ground bumps thereon.

2. Description of the Related Art

With the rapid developments in ULSI manufacturing, the function of single chip is accordingly increased, which promotes advances in packaging methods. The traditional packaging method, utilizing lead frames to connect the O/I connection, bonding pad, or wire bonding pad, and enveloping chips with ceramic or epoxy, has been proven to be difficult for the packaging of VLSI chips. It goes without saying that the traditional packaging method certainly can not fulfill the demands of the next generation of ULSI chips.

Traditionally, to prevent the shifting of bonding wires during the step of injecting the plastic material or the lengthening of the bonding wires, the bonding pads have been designed on the periphery of the chips. Therefore, longer conductive traces are needed to connect the device to the bonding pads. Moreover, as the trend of chip advances toward higher speeds and higher capabilities, the number of I/O connections is rapidly being increased. However, the high inductance created in the connection of bonding pads and bonding wires obstructs the high-speed operation of the chips.

To solve the problems described above, a packaging method for a flip-chip has been recently developed. FIG. 1 illustrates the conductive bumps (24) on the surface of a chip (20). The conductive bumps (24) are evenly disposed on the chips (20) with an array arrangement, but are not limited to the periphery of the chip (20) or the outside of the device area. By flipping the chip (20), the conductive bumps (24) are mounted to the bump pads (28) (or flip-chip bump pads) on the substrate (26). The bump pads (28) on the substrate (26) are also arranged in an array and each corresponds to the conductive bumps (24) on the chip (20).

In the inner core of the chip, the design for the flip-chip type does not differ widely with that for the wire bonding type. In the wire bonding type, the devices may not be positioned under the bonding pads. Therefore the bonding pads are positioned on the periphery of the chip, while a passivation layer covers the remaining area of the chip. In the flip-chip type, a metal layer is further provided on the passivation layer of the wire bonding type and then a lithography and an etching method are carried out thereby forming a redistribution layer. The bonding pads on the periphery of the chip are connected to the conductive bumps in the core of the chip. Therefore, the present circuit design of the wire bonding type is also applied in the design of flip-chips.

According to a conventional way, all of the conductive bumps including ground bumps, power bumps or signal bumps are mixed in the array arrangement, which increases the length of conducting traces for the signal bumps and thus lowers the speed of the operation. In U.S. Pat. No. 5,952,726, the signal bumps are positioned on the edge of the chip. The power bumps (VDD) and the ground bumps (VSS) are evenly distributed in the core of the chip, as shown in FIG. 2. The power traces (60) and the ground traces (70) are provided between the conductive bumps. The power bumps (VDD) and the ground bumps (VSS) are respectively connected to the power traces (60) and the ground traces (70) by conductive traces (65) and conductive traces (75) respectively.

In U.S. Pat. No. 5,952,726, in the bump arrangement, however, two defects remain unsolved. The impedance due to conductive traces is high and the bump density is low. In the redistribution layer, connecting lines are required for connecting the power and ground traces to the power and ground bumps, respectively. In addition, when the conductive traces of all layers are projected onto a phantom plane parallel to the layers, the possibility of projections of the traces to cross each other decreases due to the parallel arrangement of the power bus and the ground bus, which means more complex interconnecting traces or additional interconnecting traces are needed. The impedance increases when the length or the complexity of conductive traces increases. The bump density, which is the number of bumps that can be arranged in the same area, is not high enough in this arrangement because some spaces between two adjacent rows of bumps are reserved for the conductive traces. Therefore, there is a need to improve these defects.

SUMMARY OF THE INVENTION

The object of this invention is to provide a configuration of conductive bumps requiring shorter conducting traces and having less impedance on the chip.

Another object of the present invention is to provide slanted conducting traces on the redistribution layer to increase the probability that the power bus and ground bus intersect with the power traces and ground traces respectively. Still another object of the present invention is to provide a redistribution layer having a high bump density.

The present invention discloses a configuration of conductive bumps and a redistribution layer for a flip chip. The first embodiment comprises: a plurality of power bumps and ground bumps disposed in hive-shaped arrangement on the core of a flip chip; a plurality of power lines slanted at 60-degree angle, relative to a horizontal line, for connecting power bumps; and a plurality of ground lines slanted at 60-degree angle, relative to a horizontal line, for connecting ground bumps. Therefore, the probability for the power traces and ground traces to intersect with the power bus and ground bus respectively is increased. The conductive bumps of the second embodiment are disposed in a checkerboard configuration. The conductive bumps of the third embodiment are disposed in a stagger arrangement, and the power bumps and ground bumps are respectively connected by power traces and ground traces, which are slanted at 45-degree angle, relative to a horizontal line. The power traces and the ground traces are in a redistribution layer.

BRIEF DESCRIPTION OF THE DRAWINGS

The above objects and advantages of the present invention will become apparent from the following detailed description of the preferred embodiment of the present invention, with reference to the attached drawings in which.

DESCRIPTION OF THE PREFERRED EMBODIMENTS

In the traditional method, the conductive bumps (comprised of signal bumps, ground bumps and power bumps) are mixed in an array arrangement, or, the power bumps and the ground bumps are arranged in stagger. Then, a plurality of conductive traces, which are parallel to each other, is formed in the redistribution layer along a vertical or horizontal direction in order to connect the corresponding conductive bumps. If the length of the conductive traces in the redistribution layer is to be decreased, the positions of the power bus or ground bus under the redistribution layer will be limited or additional lead lines will be used to connect the conductive traces in the redistribution layer to the signal bus, ground bus, or power bus. Therefore, longer conductive traces are needed for the ground bump or power bump, thereby increasing the impedance and lowering the speed. In addition, the uneven distribution of conductive bumps will lower the speed performance, too. Moreover, it is difficult to increase the density of the conductive bumps because a space must be preserved in advance for the lead lines. The present invention discloses a method to solve the problems described above.

Figure 3:
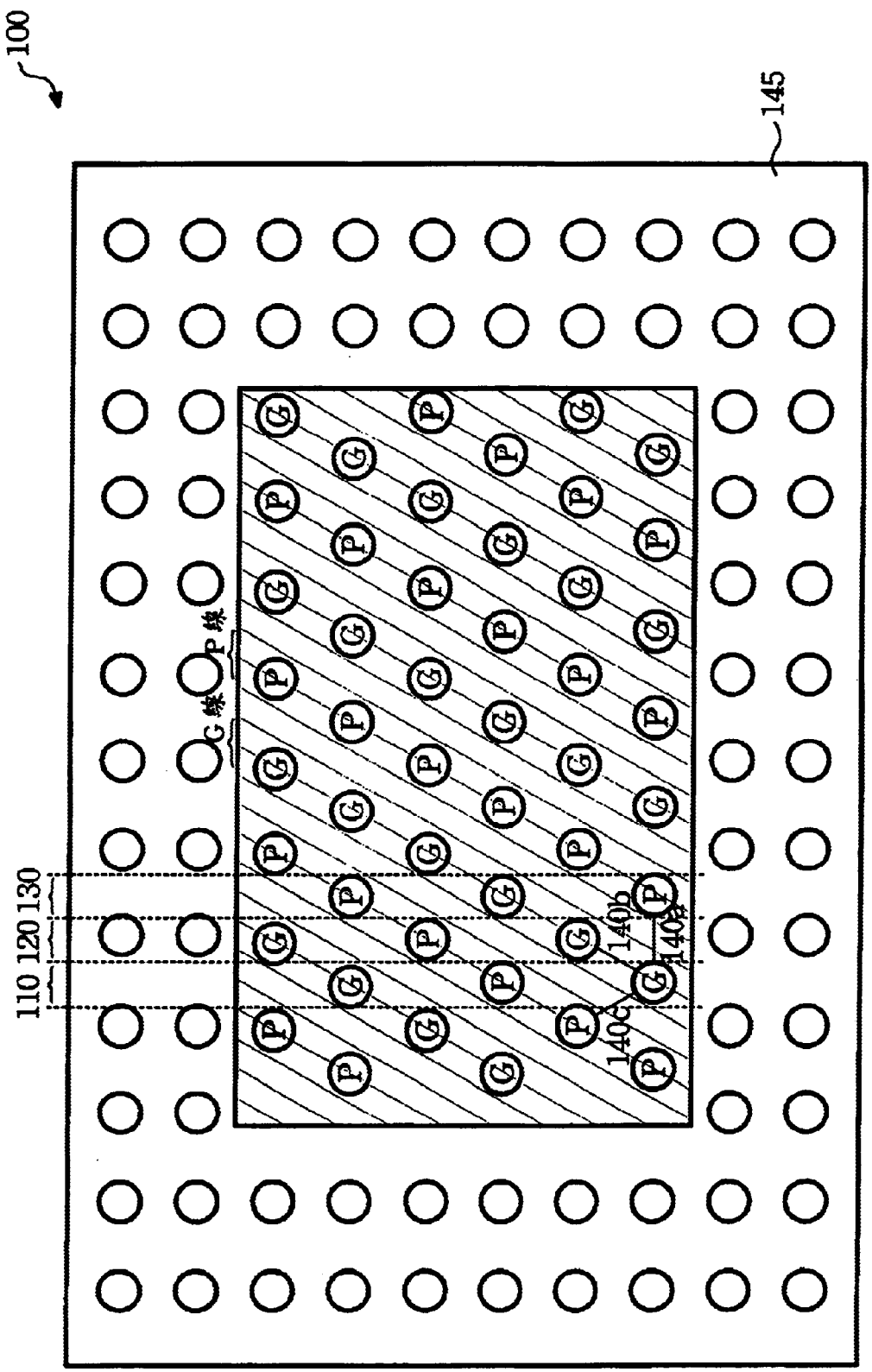
FIG. 3 illustrates the arrangement of the conductive bumps in the redistribution layer according to the first embodiment of the present invention, in which the conductive bumps are arranged in stagger and the same type of conductive bumps (G type or P type) are aligned in a slope of 60 degrees from horizon.

FIG. 3 illustrates a first preferred embodiment of the present invention. In this arrangement, the conductive bumps of the flip chip distribute in two different regions, the core region and the peripheral region. All of the signal bumps are provided out of the core of the chip. According to the present invention, the following features can be found through all the embodiments. First, the power bumps are all formed on a first group of parallel and slanted lines, P lines. The ground bumps are all formed on a second group of parallel and slanted lines, G lines. These two groups of lines are parallel and alternating to each other. Secondly, the conductive bumps are all formed on vertical lines such as lines 120, 130, and 140, as well. Along each vertical line, the power bumps and ground bumps are provided in alternation. The arrangement of power and ground bumps of all vertical lines are the same but with a vertical offset between two adjacent vertical lines. The power bumps (P) and the ground bumps (G) are evenly distributed in the core region (100). Third, the P lines and the G lines where the power and the ground bumps are located are orthogonally projected onto the P line traces and G lines traces formed on the redistribution layer. In other words, the orthogonal projections of the P lines and G lines on the redistribution layer are coincident with the power traces and ground traces thereon.

Further referring to FIG. 3, the conductive bumps are arranged in stagger. The P lines and G lines are slanted in 60-degree angle relative to horizon. The vertical offset between two adjacent vertical lines is a half vertical distance between two vertically adjacent bumps.

Figure 1:
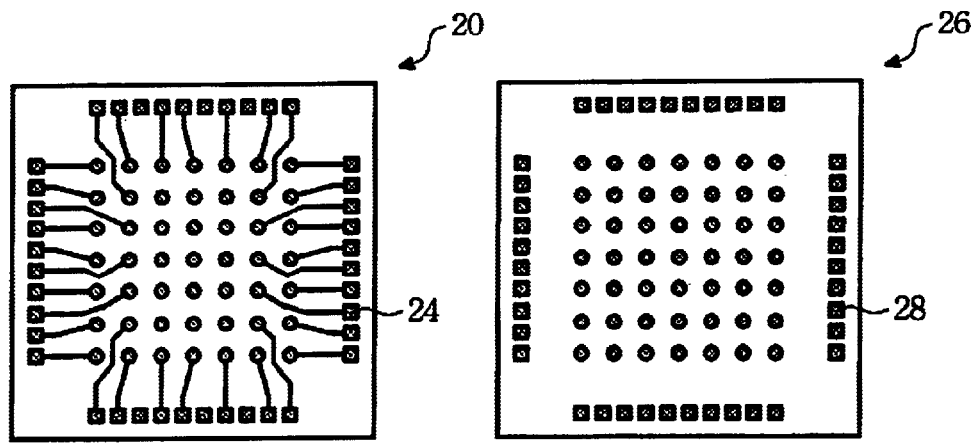
FIG. 1 shows the conductive bumps on the surface of a flip chip and the corresponding substrate with bump pads provided thereon.
Figure 2:
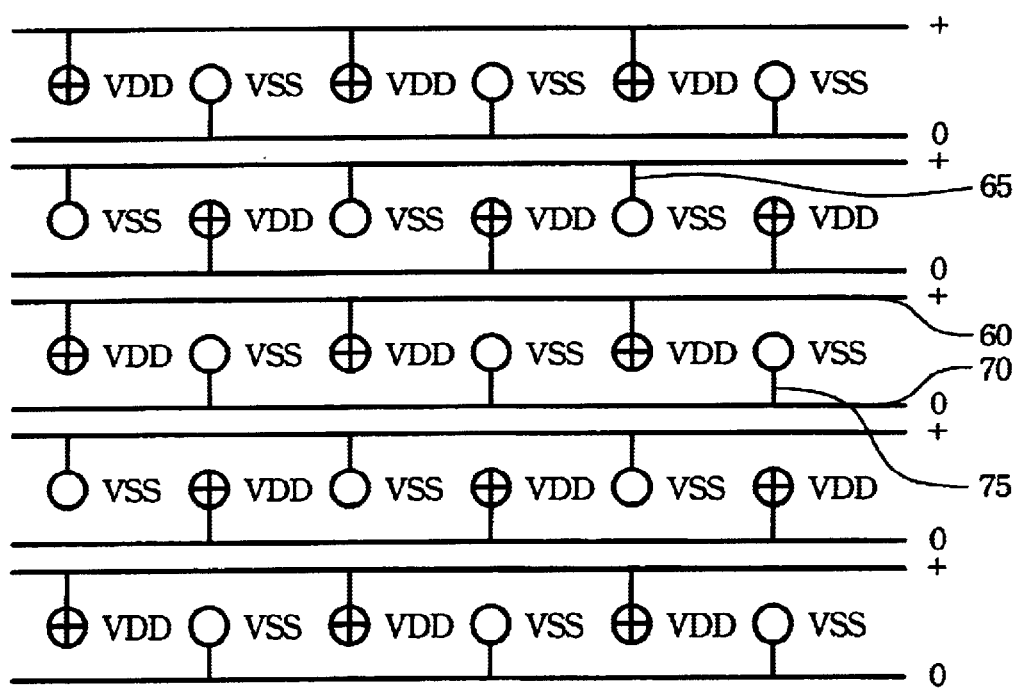
FIG. 2 shows the power bump (VDD) and the ground bump (VSS) evenly distributed in the core of a conventional flip chip.
Figure 4:
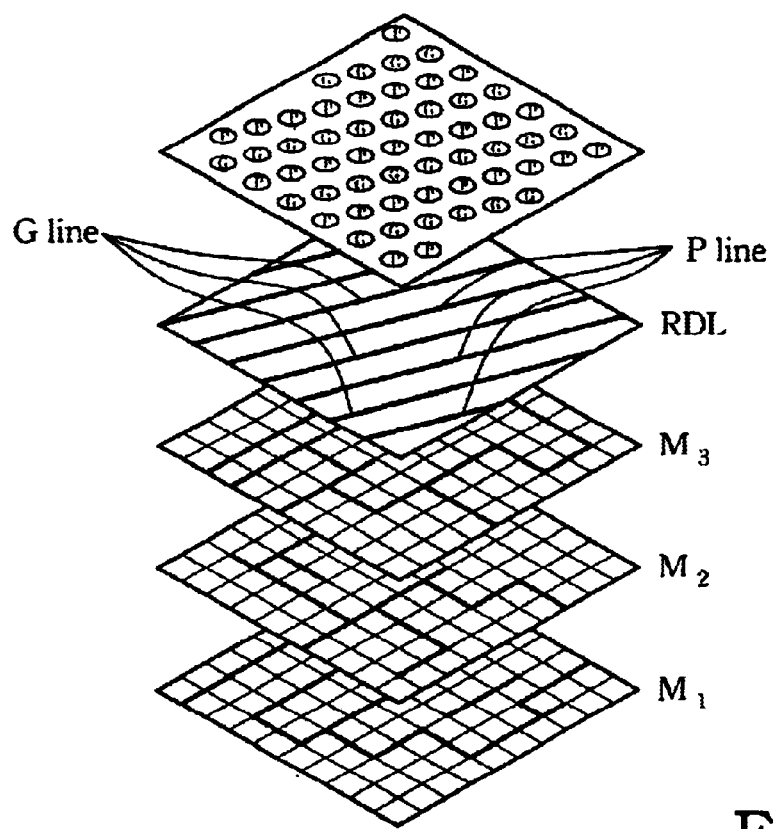
FIG. 4 shows the relative position between the redistribution layer RDL and the metal layers M1, M2, and M3 according to the present invention.

FIG. 4 illustrates the arrangement of FIG. 3 applied in a chip with three-metal layers. There are three metal layers (M1, M2, and M3) under the redistribution layer (RDL), wherein the metal lines on the M1, M2, and M3 are formed in vertical or horizontal directions. Therefore, the probability of intersection of P lines and G lines with the power bus or ground bus on the M1, M2, and M3 is greater than that found in FIG. 2, wherein the conductive traces (65) and (75) only intersect with the perpendicular power bus (60) and the ground bus (70). As the power bumps (P) and the ground bumps (G) are required to connect with the ground bus or power bus on M1, M2, M3, a plurality of through-holes are formed at the cross points. The additional conductive traces are decreased and the resistance is also reduced.

In FIG. 3, the hive-shaped arrangement has the shortest pitch and all pitches (140a, 140b, and 140c) along different directions are equal. This arrangement has the highest number of conductive bumps in the same chip area. From another point of view, the present invention, compared with the traditional method, has the highest bump density of all kinds of bump layouts in the same pitch while not causing short-circuit problems. It is easy to understand that, each 3 closest bumps can be the vertices of an equilateral triangle since the distance between each two of them are the same as the pitch. It can also be found that every such 3 bumps include one bump of a first kind (e.g. P) and two bumps of a second kind (e.g. G).

Therefore, owing to the 60-degree angle of P lines and G lines and these lines or conductive bumps are formed on a layer above the redistribution layer, the conductive traces on the redistribution layer are also formed about in the same direction.

Some of the conductive bumps may be positioned out of the core region for the power bumps (P) and ground bumps (G), and in stead, positioned in the peripheral region (145).

Figure 5:
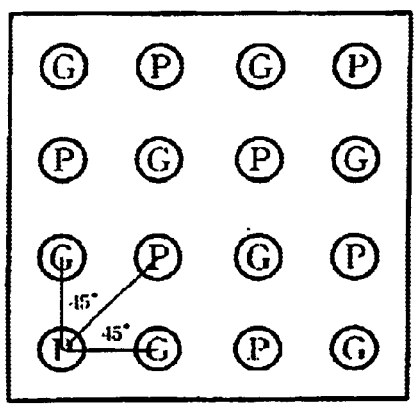
FIG. 5 shows the second embodiment of the present invention, in which the conductive bumps are arranged as a linear array and the same type of conductive bumps (G type or P type) are aligned in a slope of 45 degrees from horizon.

FIG. 5 illustrates a second embodiment of the core region of the bump layer of the present invention. The conductive bumps are positioned in array or in checkerboard arrangement. Thus, P lines and G lines are slanted in 45-degree. The vertical offset between two adjacent vertical lines is the same as the vertical distance between two vertically adjacent bumps. The conductive traces on the redistribution layer are also formed about in the same direction and the same vertical projection locations; therefore, it is not necessary to reserve extra spaces between the adjacent columns or rows of conductive bumps for the conductive traces and thus the bump density increases. In addition, since the conductive traces are provided directly under the conductive bumps, the electrical connection can be formed directly through vertical via holes or plugs without extra lateral traces formed on the redistribution layer, which decreases the length of the conductive traces in the redistribution layer and thus reduces the impedance thereof.

Figure 6:
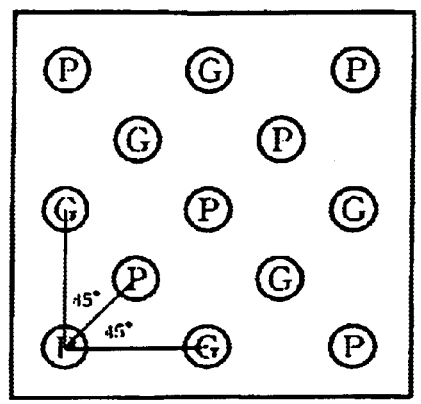
FIG. 6 shows the third embodiment of the present invention, in which the conductive bumps are arranged in stagger and the same type of conductive bumps (G type or P type) are aligned in a slope of 45 degrees from horizon.

FIG. 6 illustrates a third embodiment of the core region of the bump layer of the present invention. The conductive bumps are arranged in stagger. The P lines and G lines are slanted with 45-degree in angle, relative to a horizontal line. The vertical offset between two adjacent vertical lines is a half of the vertical distance between two vertically adjacent bumps. Accordingly, the conductive traces in the redistribution layer provided under this bump layer, corresponding to the P lines and G lines, also form 45-degree angle, relative to a horizontal line. Since the conductive traces are provided directly under the conductive bumps, the electrical connection can be formed directly through vertical via holes or plugs without extra lateral traces formed on the redistribution layer, which decreases the length of the conductive traces in the redistribution layer and thus reduces the impedance thereof.

It is observed that three adjacent conductive bumps, not positioned on the same column, also form an isosceles triangle with a right angle, wherein three adjacent conductive bumps consists of two power bumps (P) and one ground bump (G), or two ground bumps (G) and one power bump (P).

Once given the above disclosure, other features, modifications, and improvements will become apparent to the skilled artisan. Such other features, modifications, and improvements are, therefore, considered to be a part of this invention, the scope of which is to be determined by the following claims.

What is claimed is:

1. A configuration of conductive bumps and redistribution layer on a flip chip comprising:
    a plurality of power bumps forming a plurality of first lines, said first lines being slanted;
    a plurality of ground bumps forming a plurality of second lines, said second lines being slanted and each parallel to and alternatingly spaced with said first lines, wherein three closest bumps form an equilateral triangle;
    a plurality of power traces for connecting said power bumps on said first lines;
    a plurality of conductive bumps positioned out of the area of said first lines and said second lines, said conductive bumps being arranged in checkerboard arrangement; and
    a plurality of ground traces for connecting said ground bumps on said second lines.

2. The configuration of claim 1, wherein said power traces and said ground traces are formed on the same metal layer.

3. The configuration of claim 2, wherein said power traces and said ground traces are provided in said redistribution layer and connected through vias or plugs to the conductive bumps formed on a layer above said redistribution layer.

4. The configuration of claim 1, wherein orthogonal projections of said first lines and said second lines onto said redistribution layer are coincident with said power traces and said ground traces.

5. A configuration of conductive bumps and redistribution layer on a flip chip comprising:
    a plurality of power bumps forming a plurality of first lines, said first lines being slanted;
    a plurality of ground bumps forming a plurality of second lines, said second lines being slanted and each parallel to and alternatingly spaced with said first lines, wherein three closest bumps form an equilateral triangle;
    a plurality of power traces for connecting said power bumps on said first lines; and
    a plurality of ground traces for connecting said ground bumps on said second lines, wherein orthogonal projections of said first lines and said second lines onto said redistribution layer are coincident with said power traces and said ground traces.

6. The configuration of claim 5, wherein said power traces and said ground traces are formed on the same metal layer.

7. The configuration of claim 6, wherein said power traces and said ground traces are provided in said redistribution layer and connected through vias or plugs to the conductive bumps formed on a layer above said redistribution layer.

* * * * *